United States Patent [19]
Oguriyama et al.

[11] Patent Number: 5,387,893
[45] Date of Patent: Feb. 7, 1995

[54] PERMANENT MAGNET MAGNETIC CIRCUIT AND MAGNETRON PLASMA PROCESSING APPARATUS

[75] Inventors: Masami Oguriyama, Ichikawa; Haruo Okano, Tokyo; Isahiro Hasegawa, Zusi; Junichi Arami, Tokyo; Hiromi Harada, Hiratsuka, all of Japan

[73] Assignee: Tokyo Electron Limited, Tokyo, Japan

[21] Appl. No.: 28,230

[22] Filed: Mar. 9, 1993

[30] Foreign Application Priority Data

Mar. 9, 1992 [JP] Japan .................. 4-085095

[51] Int. Cl.$^6$ .................. H01F 7/02; C23C 14/00
[52] U.S. Cl. .................. 335/302; 335/306; 204/298.16; 205/89
[58] Field of Search .............. 335/302, 296, 297, 304, 335/306, 298; 204/298.16–298.22; 205/89

[56] References Cited

U.S. PATENT DOCUMENTS

| | | |
|---|---|---|
| 2,925,517 | 2/1960 | Glass . |
| 4,180,450 | 12/1979 | Morrison .................. 204/298 |
| 4,282,083 | 8/1981 | Kertesz .................. 204/298 |
| 4,461,688 | 7/1984 | Morrison .................. 204/192 R |
| 4,614,930 | 9/1986 | Hickey et al. . |
| 4,672,346 | 6/1987 | Miyamoto et al. . |
| 4,810,986 | 3/1989 | Leupold . |
| 4,842,707 | 7/1989 | Kinoshita . |
| 4,964,968 | 10/1990 | Arita . |
| 5,289,152 | 2/1994 | Oguriyama .................. 335/302 |

FOREIGN PATENT DOCUMENTS

| | | |
|---|---|---|
| 969151 | 4/1958 | Germany . |
| 1287672 | 1/1969 | Germany . |
| 2-163371 | 6/1990 | Japan . |
| 4-127504 | 4/1992 | Japan . |

*Primary Examiner*—Leo P. Picard
*Assistant Examiner*—Stephen T. Ryan
*Attorney, Agent, or Firm*—Oblon, Spivak, McClelland, Maier, & Neustadt

[57] ABSTRACT

A permanent magnet magnetic circuit comprises a main magnet block having a pair of opposite outer surfaces. A pair of main magnetic poles of opposite polarities are disposed on the respective outer surfaces of the main magnet block. The main magnet block is provided with a channel defined between the pair of outer surfaces and the channel has a pair of inner surfaces corresponding to the respective outer surfaces of the main magnet block. The main magnet block is also provided with a pair of oppositely polarized compensating magnetic poles arranged on the respective inner surfaces for controlling any vector of the magnetic field directed from one of the main magnetic pole to the other main magnetic pole. A pair of adjusting magnet blocks are arranged on the respective inner surfaces to adjust the magnetic field directed from one of the main magnetic poles to the other magnetic pole.

7 Claims, 9 Drawing Sheets

PERMANENT MAGNET MAGNETIC CIRCUIT AND MAGNETRON PLASMA PROCESSING APPARATUS

BACKGROUND OF THE INVENTION

1. Field of the Invention

This invention relates to a permanent magnet magnetic circuit to be used for a semiconductor manufacturing apparatus or a similar apparatus requiring a unidirectional magnetic field (having linear lines of magnetic force in a desired region) and, more particularly, it relates to a permanent magnet magnetic circuit that is especially useful when restrictions are imposed on its attachment or arrangement as well as to a magnetron plasma processing apparatus incorporating such a permanent magnet magnetic circuit.

2. Description of the Related Art

There is known a conventional permanent magnet magnetic circuit designed to generate a unidirectional magnetic field and comprising a U-shaped yoke having a pair of permanent magnets attached to the inside surfaces of the respective legs of the yoke in such a manner that the N pole of one magnet is opposed to the S pole of the other magnet. In such a permanent magnet magnetic circuit, only a unidirectional magnetic field directed from the N pole of said one magnet to the S pole of said other magnet is formed and contains least of unnecessary perpendicular magnetic field components.

In a permanent magnet magnetic circuit as described above, however, the region where the unidirectional magnetic field is generated is surrounded at three sides thereof by the magnetic circuit. Therefore, the magnetic circuit is not useful where restrictions are imposed on its attachment or location.

There is also known a plate shaped permanent magnet having N and S poles disposed at opposite edges thereof. A permanent magnet magnetic circuit of this type is a most fundamental one and can generate a region of an approximately unidirectional magnetic field above or below a major surface of the plate-shaped permanent magnet. The magnetic circuit of this permanent magnet is free from restrictions of attachment of a magnetic circuit unlike a permanent magnet magnetic circuit having a yoke as described above.

However, although a permanent magnet magnetic circuit of the above mentioned Second type produces a (horizontal) magnetic field in parallel with the plate-shaped permanent magnet at the central area thereof, unnecessary vertical components drastically increase with the distance from the center of the plate-shaped permanent magnet, making the magnetic field far from ideal.

SUMMARY OF THE INVENTION

Therefore, an object of the present invention is to provide a permanent magnet magnetic circuit capable of generating a desired unidirectional magnetic field substantially free of perpendicular components and having a simple structure without significant restrictions of attachment.

Another object of the present invention is to provide a magnetron plasma processing apparatus incorporating such a permanent magnet magnetic circuit.

According to a first aspect of the invention, there is provided a permanent magnet magnetic circuit comprising a main magnet block having a pair of opposite outer surfaces, a pair of main magnetic poles of opposite polarities disposed on the respective outer surfaces of the main magnet block, compensating magnetic pole means for controlling the vectorial direction of the magnetic field directed from one of said main magnetic poles to the other magnetic pole, and adjusting magnetic field generating means provided between said opposite outer surfaces of said main magnet block for producing a magnetic field directed to a direction other than the direction of magnetization of said main magnet block to control the magnetic field directed from one of said main magnetic poles to the other main magnetic pole.

According to a second aspect of the present invention, there is provided a magnetron plasma processing apparatus comprising a processing vessel, a pair of electrodes provided in said processing vessel to define a processing space for setting an object to be processed, a power supply for supplying electric power to said electrodes, a permanent magnet magnetic circuit for producing a magnetic field perpendicular to the electric field produced between said electrodes in said processing space and processing gas supply means for supplying processing gas between said electrodes, said permanent magnet magnetic circuit comprising on its part a main magnet block having a pair of opposite outer surfaces, a pair of main magnetic poles of opposite polarities disposed on the respective outer surfaces of the main magnet block, compensating magnetic pole means for controlling the vectorial direction of the magnetic field directed from one of said main magnetic poles to the other magnetic pole, and adjusting magnetic field generating means provided between said opposite outer surfaces of said main magnet block for producing a magnetic field directed to a direction other than the direction of magnetization of said main magnet block to control the magnetic field directed from one of said main magnetic poles to the other main magnetic pole, said orthogonal electromagnetic field generating magnetron discharge in said processing space in order to perform a magnetron plasma processing on said object of processing.

With a permanent magnet magnetic circuit according to the invention, any vertical components (those magnetic field components vertical to the magnetic field components running in a desired direction) contained in the magnetic field existing between the main magnetic poles of the main magnet block can be offset by oppositely oriented vertical components contained in the magnetic field produced between the compensating magnetic pole means of the main magnet block and the main magnetic electrode and the magnetic field generated by said adjusting magnetic field generating means so that a desired unidirectional magnetic field which is free of unnecessary vertical components over a wide area can be obtained. The effect of the adjusting magnetic field generating means can be easily adjusted simply by changing the size and shape of the adjusting magnetic field generating means without changing the surface area of the compensating magnetic pole means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Now, the present invention will be described in greater detail by referring to the accompanying drawings that illustrate preferred embodiments of the invention.

Figure 1:
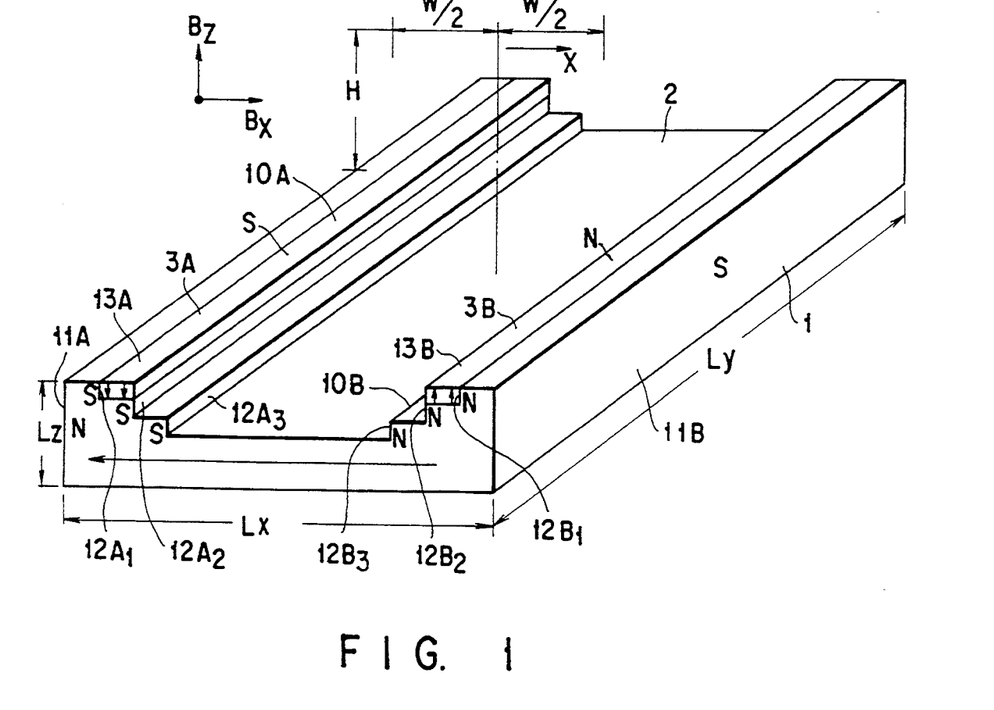
FIG. 1 is a perspective view of a first embodiment of a permanent magnet magnetic circuit according to the invention.
Figure 2:
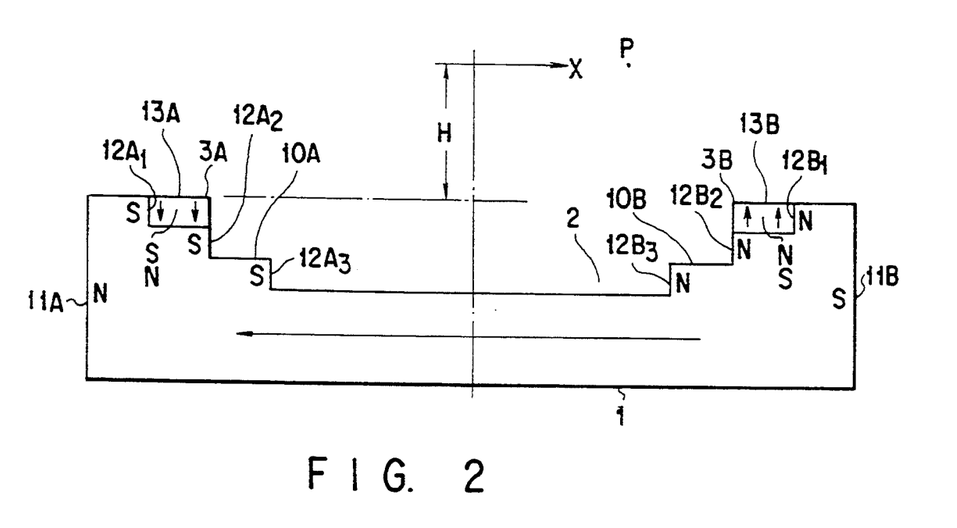
FIG. 2 is a sectional front view of the embodiment of FIG. 1.

Referring firstly to FIGS. 1 and 2, there is illustrated a permanent magnet magnetic circuit according to a first embodiment of the present invention. The circuit comprises a rectangular main magnet block 1 of a suitable permanent magnet material such as ferrite or rare earth permanent magnet. The block has a pair of first and second opposite end surfaces (a first main surface and a second main surface opposite to the first) which are magnetized to opposite polarities to produce main magnetic poles 11A, 11B. Here, the main magnetic poles 11A, 11B are respectively N and S poles. A channel 2 having symmetrical stepped side walls 10A, 10B is formed on a lateral surface between the opposite end surfaces of the main magnet block 1. The lateral surface is perpendicular or substantially perpendicular to the opposite end surfaces. The stepped side wall 10A of the channel 2 close to (and opposite to) said main magnetic pole 11A is magnetized to produce compensating magnetic poles $12A_1$, $12A_2$, $12A_3$. Similarly, the stepped side wall 10B of the channel 2 close to (and opposite to) said main magnetic pole 11B is magnetized to produce compensating magnetic poles $12B_1$, $12B_2$, $12B_3$. A pair of rectangular adjusting magnet blocks 3A, 3B made of a permanent magnet material the same as or different from that of the main magnet block 1 are secured to the respective horizontal top steps of the stepped side walls 10A, 10B that carry respectively compensating magnetic poles $12A_1$, $12B_1$ and abut respective sections of the stepped side walls 10A, 10B that are magnetized to produce said compensating magnetic poles $12A_1$, $12B_1$. Said adjusting magnet blocks 3A, 3B are magnetized in directions perpendicular or substantially perpendicular to the magnetized direction of the main magnet block 1 between main magnetic poles 11A, 11B. The open top surfaces of the adjusting magnet blocks 3A, 3B that do not abut the respective stepped side walls 10A, 10B have adjusting magnetic poles 13A, 13B respectively.

While the main magnetic poles and the compensating magnetic poles may have a same and identical surface magnetic flux density if the main magnet block 1 is materially uniform and consistent, the overall amount of magnetic flux of the main magnetic poles is far greater than that of the compensating magnetic poles.

Note here that the compensating magnetic poles $12A_1$, $12A_2$, $12A_3$ are S poles, whereas the compensating magnetic poles $12B_1$, $12B_2$, $12B_3$ are N poles. These compensating magnetic poles act to compensate the vertical components of the magnetic field generated there so that it may show straight lines of magnetic force. They will be described in greater detail hereinafter.

The adjusting magnet block 3A has an N pole on its lower surface that abuts the horizontal step extending from the bottom of the side wall section carrying the compensating magnetic pole $12A_1$ and a S pole that acts as an adjusting magnetic pole 13A on its upper surface. The adjusting magnet block 3B, on the other hand, has an S pole on its lower surface that abuts the horizontal step extending from the bottom of the side wall section carrying the compensating magnetic pole $12B_1$ and an N pole that acts as an adjusting magnetic pole 13B on its upper surface. These adjusting magnetic poles further compensate the magnetic field which is compensated by the compensating magnetic poles so that the lines of magnetic force may be made even more straight. These adjusting magnet blocks will be described in greater detail hereinafter.

Figure 3:
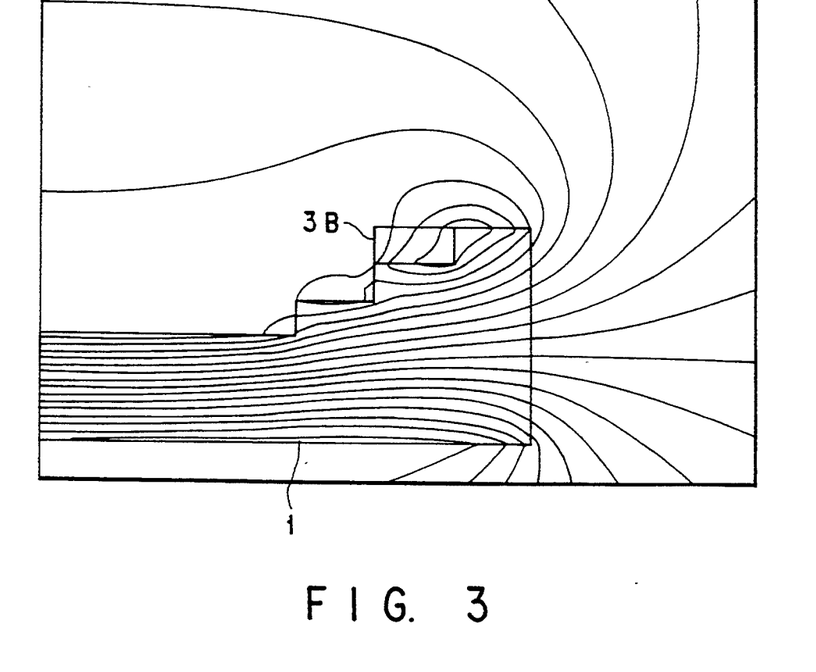
FIG. 3 is a schematic illustration of the distribution of lines of magnetic force of the first embodiment of the permanent magnet magnetic circuit of FIG. 1.

FIG. 3 schematically illustrates the distribution of lines of magnetic force of this first embodiment of the permanent magnet magnetic circuit. In FIG. 3, the main magnet block 1 has a lateral dimension Lx of 250 mm, a transverse dimension Ly of 300 mm and a thickness L of 60 mm and each of the steps of the side walls of the channel 2 has a width of 20 mm and a height of 10 mm. Each of the adjusting magnet blocks 3A, 3B has a lateral dimension of 20 mm, a height of 10 mm and a transverse dimension of 30 mm and is made of a ferrite permanent magnet.

Figure 4:
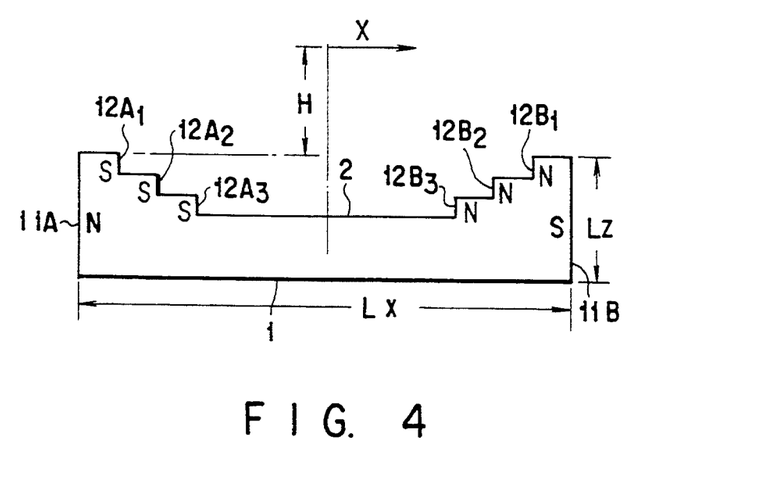
FIG. 4 is a sectional view similar to FIG. 2 but showing a permanent magnet magnetic circuit previously disclosed by the inventors of the present invention.

FIG. 4 is a sectional view showing a permanent magnet magnetic circuit previously invented by the inventors of the present invention and disclosed in a pending U.S. patent application (U.S. patent application No. 7/762,374 filed on Sep. 19, 1991—inventors: Masami OGURIYAMA et al.) that can also generate a unidirectional magnetic field. As apparent from FIG. 4, this permanent magnet magnetic circuit can be realized by removing the adjusting magnet blocks 3A, 3B from the permanent magnet magnetic circuit of FIGS. 1 and 2.

The permanent magnet magnetic circuit of FIG. 4 is designed to offset the vertical components of the magnetic field produced between the main magnetic poles (magnetic field components perpendicular to the desired unidirectional magnetic field components) by vertical components of opposite orientation contained in the magnetic field generated between the main and compensating magnetic poles in order to form a unidirectional magnetic field free of unnecessary vertical components over a wide area.

Figure 5:
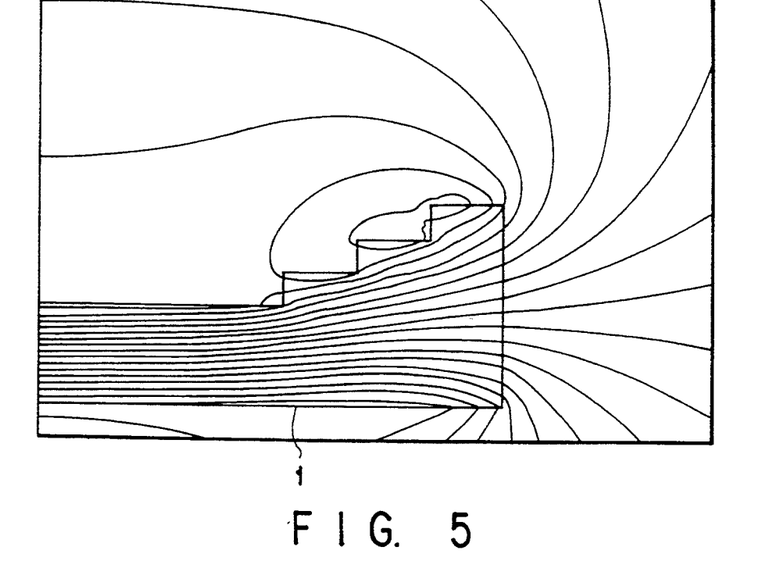
FIG. 5 is a schematic illustration of the distribution of lines of magnetic force of the permanent magnet magnetic circuit of FIG. 4.

FIG. 5 schematically illustrates the distribution of lines of magnetic force of the permanent magnet magnetic circuit of FIG. 4. The main magnet block 1 of the circuit of FIG. 4 has a shape and dimensions identical with those of the main magnet block 1 of FIG. 3.

Assume a point having a horizontal distance from the center of the main magnet block 1 is X (mm) and a vertical distance of H equal to 40 mm (constant) from the upper surface of the main magnet block 1. Both the horizontal component Bx and the vertical component Bz of the magnetic flux density of the circuit of FIG. 4 as a function of distance X (mm) are shown in the solid lines of FIG. 6. As seen FIG. 6, while the permanent magnet magnetic circuit of FIG. 4 can produce a unidirectional magnetic field substantially free of unnecessary vertical component within a limited area, the unnecessary vertical component Bz remarkably increases when the distance X (mm) exceeds 50 mm. Because the permanent magnet magnetic circuit of FIG. 4 can generate a unidirectional and ideal magnetic field only within a limited distance from the center of the main magnet block, the lateral dimension Lx of the main magnet block needs to be made very large to obtain a large unidirectional magnetic field. Additionally, if the vertical components of the magnetic field produced between the main magnetic poles is offset by the vertical components of opposite orientation contained in the magnetic field generated between the main and compensating magnetic poles, the surface area of the compensating magnetic poles needs to be adjusted appropriately because the surface magnetic flux density of the main magnetic poles and that of the adjusting magnetic poles are the same if the main magnet block 1 is made of a consistent uniform material. This makes any fine adjustment for producing a desired unidirectional magnetic field rather difficult. Finally, when the vertical components of the magnetic field generated between the main and compensating magnetic poles for offsetting the vertical components of the magnetic field between the main magnetic poles are increased, the thickness Lz of the compensating magnetic block should be increased to increase the surface area of the compensating magnetic pole portions. Obviously, such measures are disadvantageous in an attempt to down-size the entire circuit.

Figure 6:
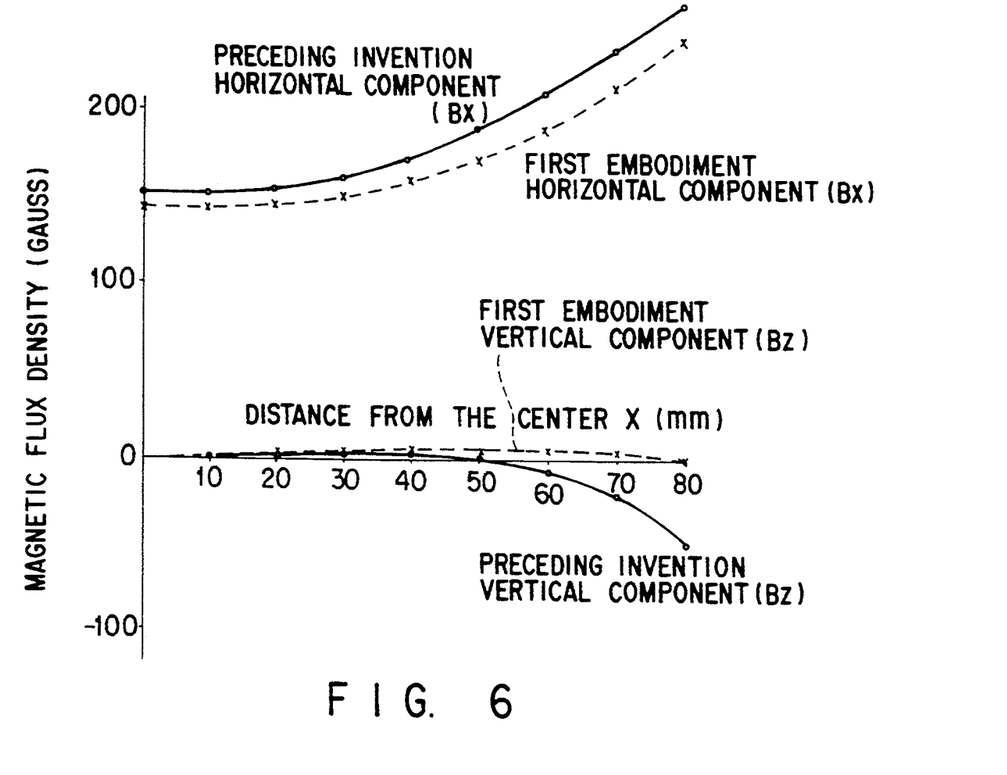
FIG. 6 is a diagram showing the magnetic flux density in horizontal and vertical directions relative to the distance from the magnet block center in the first embodiment of the invention and in the permanent magnet magnetic circuit as illustrated in FIG. 4.
Figure 7:
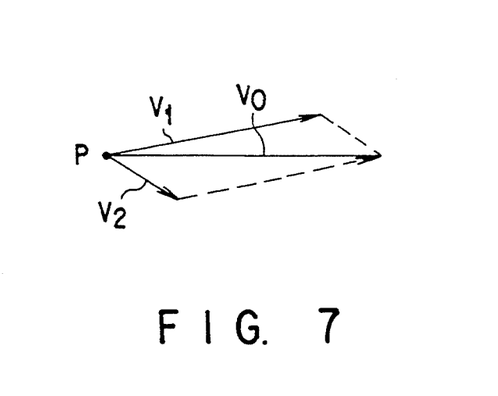
FIG. 7 is a schematic illustration of a vector for the magnetic field between the main magnetic poles, a vector for the magnetic field between one of the main magnetic poles and the compensatory magnetic pole and the resultant vector of the two vectors of the first embodiment of FIG. 1.

Contrary to this, the broken lines of FIG. 6 show that the unnecessary vertical components Bz of the magnetic field of the embodiment of FIGS. 1 and 2 are practically negligible over a wide range of distance X and hence the embodiment of FIG. 1 is advantageous over the circuit of FIG. 4. This is because, as illustrated in FIG. 7, the compound magnetic field vector V0, at point P within the region to be produced a unidirectional magnetic field which is formed by composing a magnetic field vector V1 between the main magnetic poles directed from the N pole to the S pole and a magnetic field vector V2 between either one of the main magnetic poles (N or S pole) and the corresponding compensating magnetic pole (S or N pole) and adjusting magnetic pole (S or N pole) can be made substantially horizontal by adjusting the magnetic field vector V2 by means of the adjusting magnetic pole (S or N pole) of the adjusting magnet block located near the main magnetic pole (N or S pole) even if the point is close to the stepped side wall of the channel 2 where the distance X is large.

Consequently, the embodiment of FIGS. 1 and 2 can produce a substantially ideal and unidirectional magnetic field which is free of unnecessary vertical components over a wide area. Advantageously, the above described adjustment of the magnetic field vector V2 can be easily achieved by modifying the size and shape of the adjusting magnet block without increasing the surface area of the compensating magnetic poles. The magnetic field V2 can be adjusted by means of the adjusting magnetic poles without increasing the surface area of the compensating magnetic poles. Moreover, since the overall area of generating a unidirectional magnetic field can be enlarged without increasing the surface area of the compensating magnetic poles, the main magnet block can be made significantly thinner than the main magnet block of FIG. 4 and therefore a permanent magnet magnetic circuit as illustrated in FIGS. 1 and 2 can be advantageously used in a semiconductor manufacturing apparatus. Finally, the use of an adjusting magnet block as described above is advantageous in that it can control not only the direction of the magnetic field but also the magnetic field intensity near the stepped side walls of a main magnet block of the type under consideration.

Figure 8:
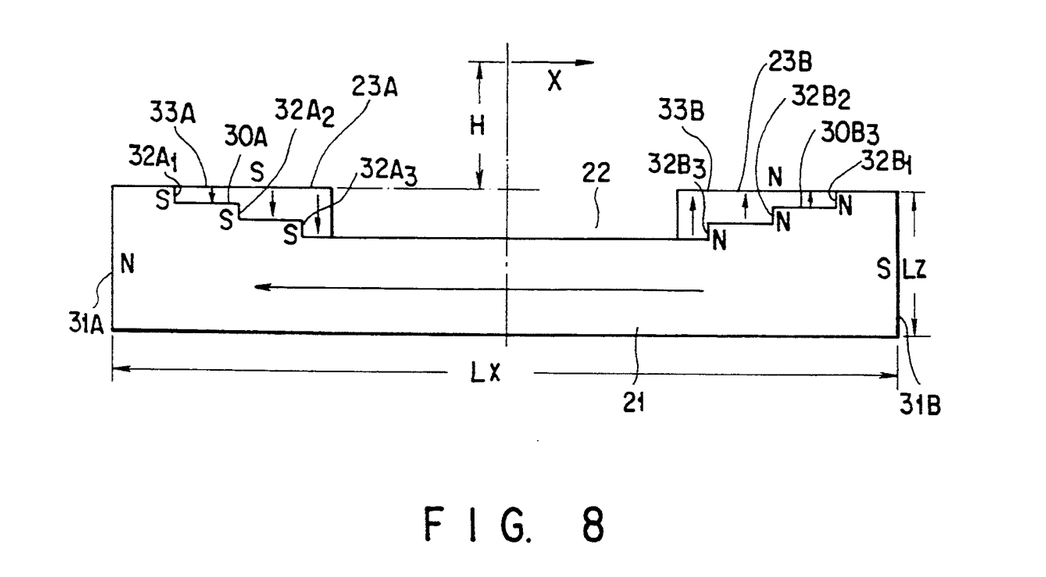
FIG. 8 is a sectional front view of a second embodiment of a permanent magnet magnetic circuit according to the invention.
Figure 9:
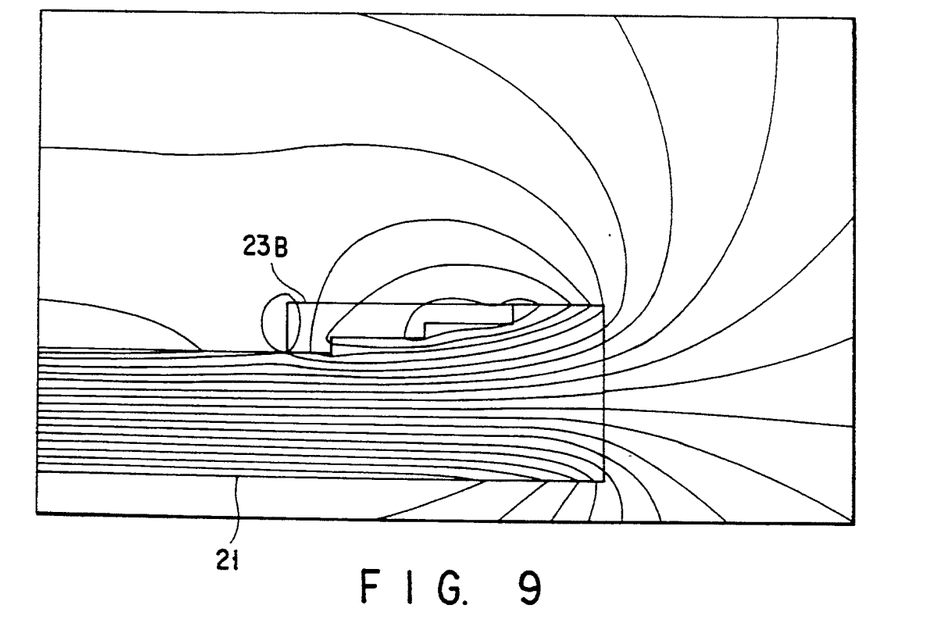
FIG. 9 is a schematic illustration of the distribution of lines of magnetic force of the second embodiment of the permanent magnet magnetic circuit of FIG. 8.
Figure 10:
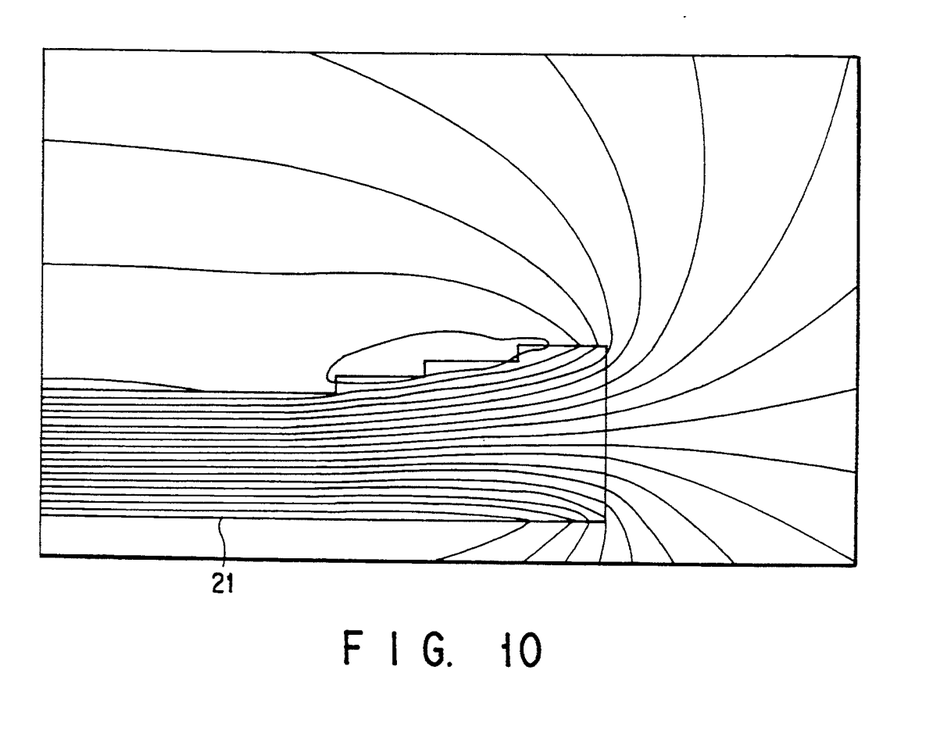
FIG. 10 is a schematic illustration of the distribution of lines of magnetic force of a permanent magnet magnetic circuit which is similar to the second embodiment of FIG. 8 but does not have an adjusting magnet block.

Now, the second embodiment of a permanent magnet magnetic circuit will be described by referring to FIG. 8. In FIG. 8, main magnetic poles 31A, 31B are formed respectively on a pair of opposite end surfaces (a first main surface and a second main surface opposite to the first) of a main magnet block 21. A channel 22 having symmetrical stepped side walls 30A, 30B is formed on a lateral surface between said opposite end surfaces of the main magnet block 21. The lateral surface is perpendicular or substantially perpendicular to the opposite end surfaces. The stepped side wall 30A of the channel 22 close to (and opposite to) said main magnetic pole 31A is magnetized to produce compensating magnetic poles $32A_1, 32A_2, 32A_3$. Similarly, the stepped side wall 30B of the channel 22 close to (and opposite to) said main magnetic pole 31B is magnetized to produce compensating magnetic poles $32B_1, 32B_2, 32B_3$. The main magnet block 21 of this embodiment has an overall height Lz smaller than that of the main magnet block 1 of the first embodiment and hence each of the steps of this embodiment has a height smaller than that of its counterpart of the first embodiment. A pair of adjusting magnet blocks 23A, 23B made of a permanent magnet material same as or different from that of the main magnet block 21 and having stepped side walls that matches the respective corresponding stepped side walls of the channel 21 are secured to said respective corresponding stepped side walls of the channel 21. The adjusting magnet blocks 23A, 23B are magnetized in directions perpendicular or substantially perpendicular to the magnetized direction of the main magnet block 21 between magnetic poles 31A, 31B. The open top surfaces of the adjusting magnet block 23A, 23B that do not abut the respective corresponding stepped side walls 30A, 30B have adjusting magnetic poles 33A, 33B. FIG. 9 schematically illustrates the distribution of lines of magnetic force of this second embodiment of permanent magnet magnetic circuit of FIG. 8. In FIG. 9, the main magnet block 21 has a lateral dimension Lx of 250 mm, a transverse dimension of 300 mm and a thickness Lz of 42 mm and each of the steps of the side walls of the channel 22 has a width of 20 mm and a height of 4 mm and is made of a ferrite permanent magnet. Each of the adjusting magnet blocks 23A, 23B has a lateral dimension of 50 mm and is made of a ferrite permanent magnet. For the purpose of comparison, the distribution of lines of magnetic force of a permanent magnet magnetic circuit that is not provided with adjusting magnet blocks 23A, 23B having a stepped abutting surface in FIG. 10. The permanent magnet magnetic circuit of FIG. 10 has a configuration similar to that of the permanent magnet magnetic circuit of FIG. 9 except that the former is devoid of the adjusting magnet blocks 23A, 23B.

Figure 11:
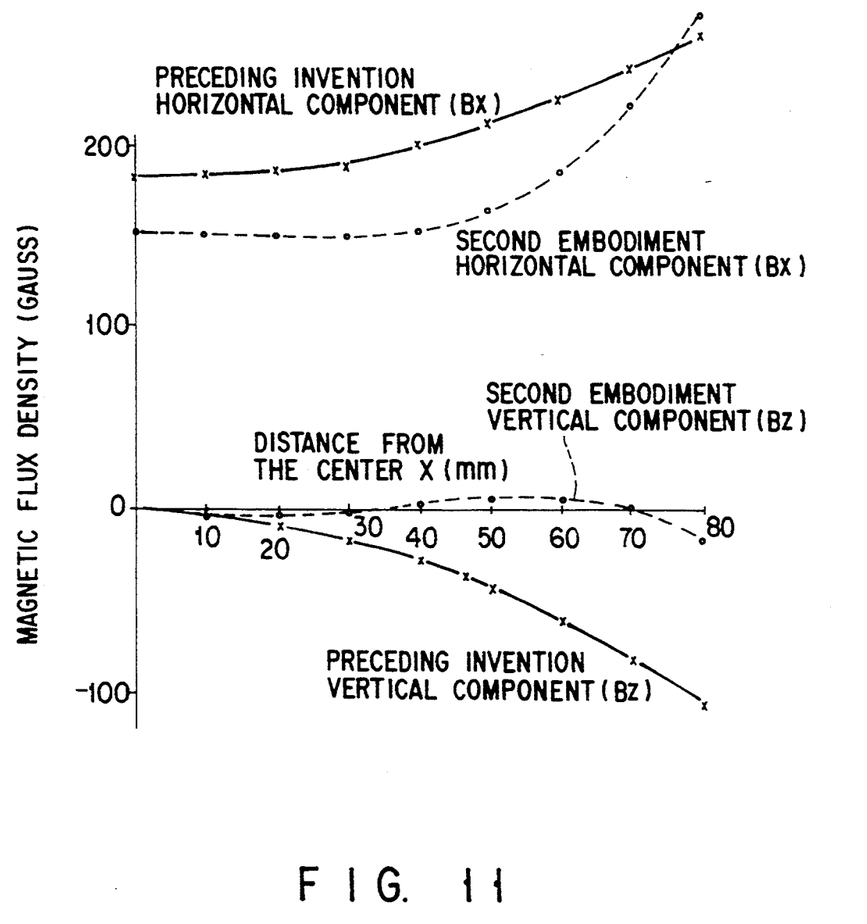
FIG. 11 is a diagram showing the magnetic flux density in horizontal and vertical directions relative to the distance from the magnet block center in the second embodiment of the invention and in the permanent magnet magnetic circuit as illustrated in FIG. 10.

Assume a point having a horizontal distance from the center of the main magnet block 1 is X (mm) and a vertical distance of H equal to 40 mm (constant) from the upper surface of the main magnet block 21. Then, both the horizontal component Bx and the vertical component Bz of the magnetic flux density at the point can be expressed as a function of distance X (mm). In FIG. 11, dotted lines show the horizontal component Bx and the vertical component Bz of the magnetic flux density of the circuit of FIG. 8 as a function of distance X (mm) from the center of the main magnet block 21, whereas solid lines those of the permanent magnet magnetic circuit which is devoid of adjusting magnet blocks 23A, 23B.

From FIG. 11, it is clear that, unlike a permanent magnet magnetic circuit devoid of adjusting magnet blocks having a stepped abutting side wall, the magnetic field of a permanent magnet magnetic circuit provided with adjusting magnet blocks having a stepped side wall as illustrated in FIG. 8 has vertical components Bz that are practically negligible over a wide range of distance X. In addition to the advantageous features of the first embodiment, the second embodiment is particularly advantageous in that it can provide a unidirectional magnetic field over a wide range even if the height Lz of the main magnet block 21 is made even smaller. Thus, the permanent magnet magnetic circuit of the second embodiment may be thinner.

Figure 12:
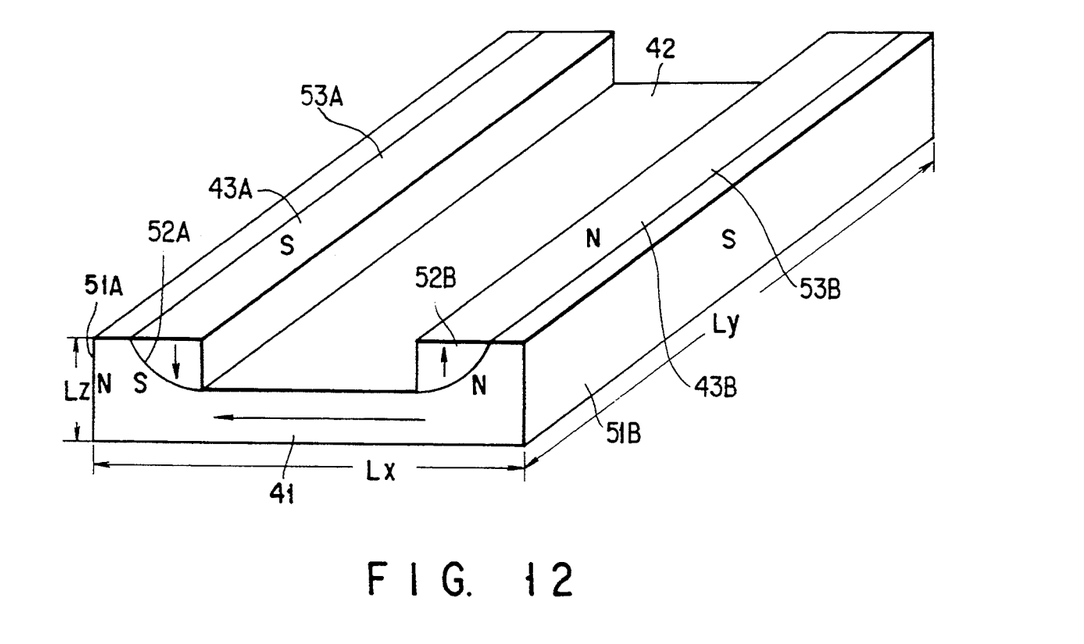
FIG. 12 is a perspective view of a fourth embodiment of a permanent magnet magnetic circuit according to the invention.
Figure 13:
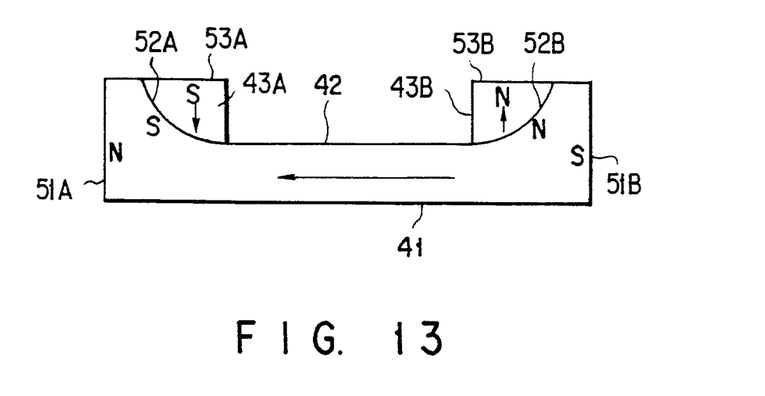
FIG. 13 is a sectional front view of the embodiment of FIG. 12.

Now, the third embodiment of a permanent magnet magnetic circuit of the invention will be described by referring to FIGS. 12 and 13. In FIGS. 12 and 13, unlike the foregoing embodiments, the main magnet block 41 of this embodiment is provided on a lateral surface thereof with a channel 42 having a pair of symmetrically sloped side walls (showing a curved or straight sectional view), which are magnetized to produce compensating magnetic poles 52A, 52B located respectively opposite to main magnetic poles 51A, 51B. When the main magnetic poles 51A, 51B are N and S poles respectively, the corresponding compensating magnetic poles 52A and 52B are S and N poles respectively. A pair of adjusting magnet blocks 43A, 43B made of a permanent magnet material same as or different from that of the main magnet block 41 and having slopes that match the respective corresponding slopes of the channel 42 are secured on the slopes of the channel 42. These adjusting magnet blocks 43A, 43B are magnetized in a direction perpendicular to or substantially perpendicular to the magnetized direction of the main magnet block 41. The open top surface of the adjusting magnet blocks 43A, 43B that do not abut the respective sloped side walls have adjusting magnetic poles 53A (S), 53B (N) respectively.

The main magnet block 41 has a lateral dimension Lx of 250 mm, a transverse dimension Ly of 300 mm and a thickness Lz of 60 mm and the channel 42 has a width of 130 mm at the bottom, and a height of 30 mm from the bottom to the top. In the third embodiment too, as seen from FIG. 7, the composed magnetic field vector V0 which is formed by composing a magnetic field vector V1 between the main magnetic poles directed from the N pole to the S pole and a magnetic field vector V2 between either one of the main magnetic poles (N or S pole) and the corresponding compensating magnetic pole (S or N pole) and adjusting magnetic pole (S or N pole) can be made substantially horizontal over a wide range in the region to produce a unidirectional magnetic field.

Figure 14:
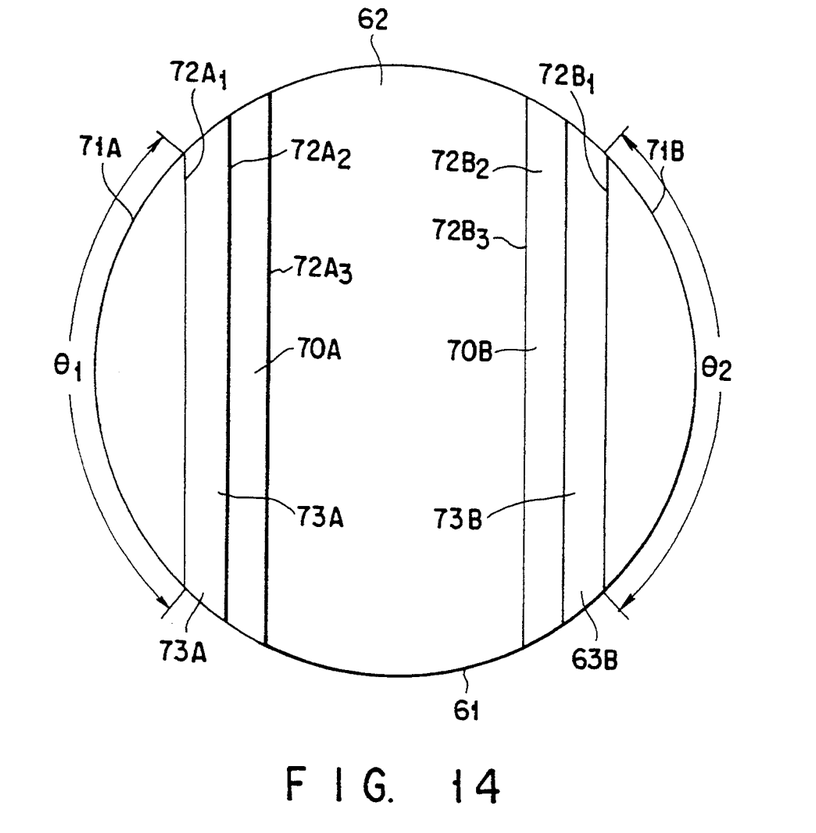
FIG. 14 is a perspective view of a fifth embodiment of a permanent magnet magnetic circuit according to the invention.
Figure 15:
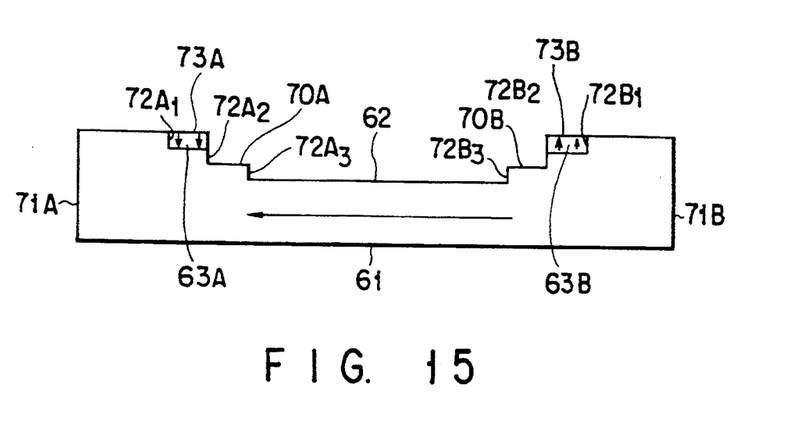
FIG. 15 is a sectional front view of the embodiment of FIG. 14.

Finally, the fourth embodiment of a permanent magnet magnetic circuit will be described by referring to FIGS. 14 and 15. In this embodiment, a disc-shaped main magnet block 61 is used. Main magnetic poles 71A, 71B are formed on respective opposite circular arc surfaces (a first circular arc surface having a central angle of $\theta 1$ and a second circular arc surface having a central angle of $\theta 2$) of magnet block 61. The main magnetic poles 71A, 71B are respectively N and S poles. A channel 62 having symmetrical stepped side walls is formed on a lateral surface of the main magnet block 61 which is perpendicular or substantially perpendicular to the lateral surface where said main magnetic poles are formed. The stepped side wall 70A of the channel 62 close to (and opposite to) said main magnetic pole 71A is magnetized to produce compensating magnetic poles $72A_1, 72A_2, 72A_3$. Similarly, the stepped side wall 70B of the channel 62 close to (and opposite to) said main magnetic pole 71B is magnetized to produce compensating magnetic poles $72B_1, 72B_2, 72B_3$. A pair of rectangular adjusting magnet blocks 63A, 63B made of a permanent magnet material same as or different from that of the main magnet block 61 are secured to the respective horizontal top steps of the stepped side walls 70A, 70B that carry respectively compensating magnetic poles $72A_1, 72B_1$ and abut respective sections of the stepped side walls 10A, 10B that are magnetized to produce said compensating magnetic poles 72A₁, 72B₁. Said adjusting magnet blocks 63A, 63B are magnetized in a direction perpendicular or substantially perpendicular to the magnetized direction of the main magnet block 61 between main magnetic poles 71A, 71B and the open top surfaces of the adjusting magnet blocks 63A, 63B that do not abut the respective stepped side walls 70A, 70B have adjusting magnetic poles 73A, 73B respectively.

This fourth embodiment of the permanent magnet magnetic circuit is substantially as effective as the first embodiment described earlier.

Thus, with a permanent magnet magnetic circuit according to the present invention, a unidirectional magnetic field free of unnecessary perpendicular magnetic field components can be produced over a wide range and the density of the obtained unidirectional magnetic field can be finely adjusted. Thus, the circuit is suitable for use in a semiconductor manufacturing apparatus or other apparatus that requires a unidirectional magnetic field over a wide range. Such a permanent magnet magnetic circuit may be particularly suitably used for a magnetron plasma processing apparatus such as a magnetron plasma etching apparatus in which magnetron discharges are realized by means of crossed electromagnetic fields.

Figure 16:
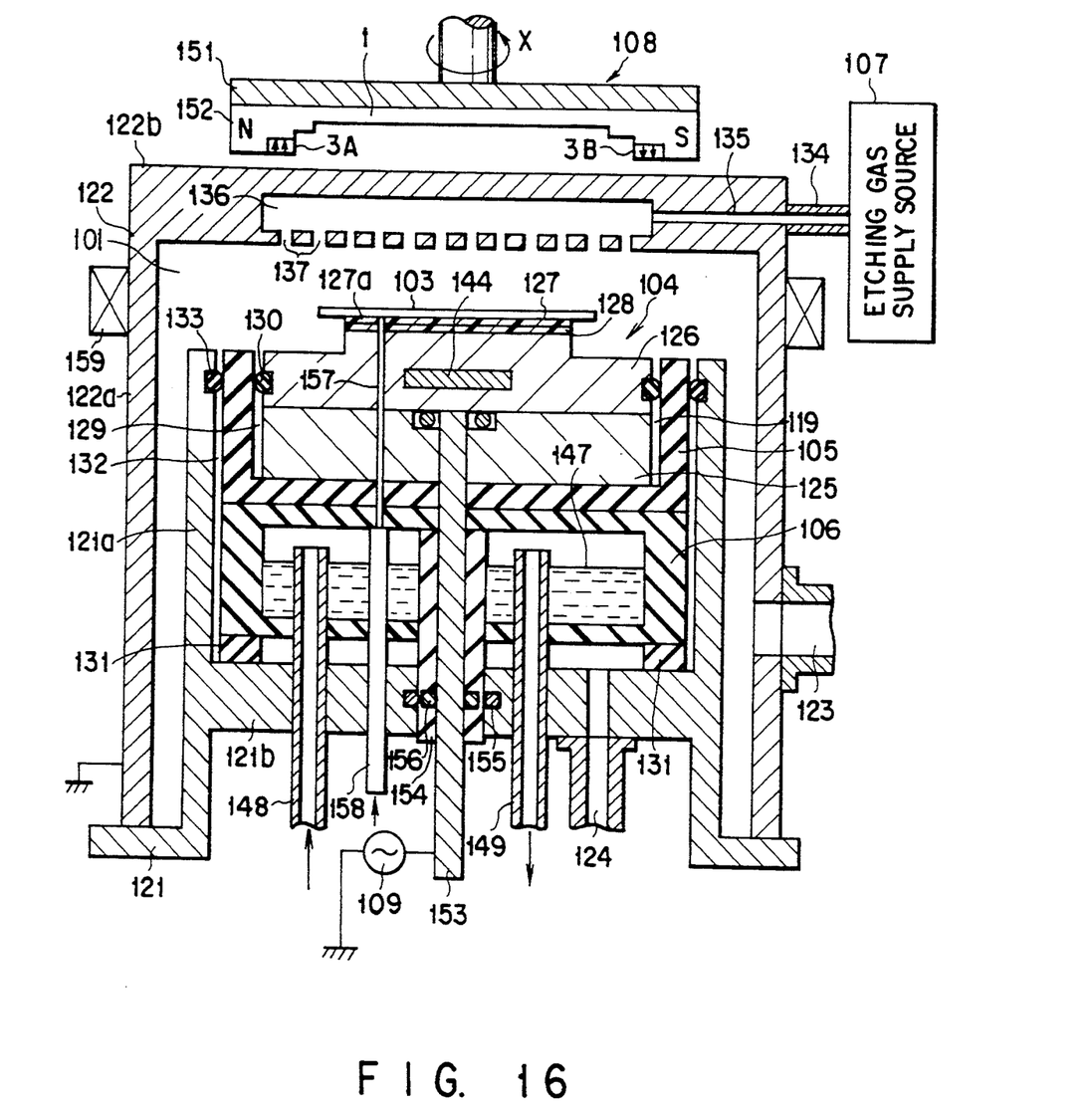
FIG. 16 is a sectional view of a magnetron plasma etching apparatus incorporating a permanent magnet magnetic circuit according to the invention.

Now, a magnetron plasma etching apparatus incorporating a permanent magnet magnetic circuit according to the invention will be described. FIG. 16 is a schematic sectional view of such a magnetron plasma etching apparatus. The magnetron plasma etching apparatus comprises a vacuum chamber 101, a support table 104 (susceptor) disposed in said vacuum chamber 101 for supporting an object to be processed 103 such as a semiconductor wafer, a support table accommodating section 105 typically made of an electrically insulating ceramic material, a liquid nitrogen containing section 106 disposed below the section 105, an etching gas supply source 107 for supplying etching gas into the vacuum chamber 101, a magnet section 108 positioned above the vaccum chamber 101 and an RF power supply 109 connected to said support table 104.

The vacuum chamber 101 comprises a lower chamber 121 and an upper chamber 122. The lower chamber 121 comprises a side wall 121a that surrounds the side wall of the support table accommodating section 105 and that of the liquid nitrogen containing section 106 and a bottom wall 121b supporting the sections 105, 106. The upper chamber 122 comprises a cylindrical side wall 122a surrounding the side wall 121a of the lower chamber 121 and an upper wall 121a that operates as an upper electrode. An exhaust port 123 is disposed at a lower portion of the side wall 122a of the upper chamber 122 and an exhaust means surface vacuum pump (not shown) is connected to the exhaust port 123. The inner pressure of the chamber 101 can be reduced about $10^{-6}$ Torr by operating the exhaustion means. The lower chamber 121 is also provided with an exhaust port 124 at the bottom wall 121b so that the lower chamber may be evacuated by an appropriate exhaust means (not shown).

A disc-shaped space 136 is provided within the upper wall 122b of the upper chamber 122 in a manner to face the support table 104. A large number of gas diffusion holes 137 are formed to permit communication between the space 136 and inner region of the chamber 101. The space 136 communicates with the etching gas supply source 107 through a gas inlet hole 135 and a gas inlet pipe 134 so that etching gas can be fed into a plasma forming region in vacuum chamber 101 from the etching gas supply source 107 by the way of the gas supply pipe 134, the gas supply hole 135, the space 136 and the diffusion holes 137. If necessary, means for heating the processing gas above room temperature may be provided and processing gas may be introduced into the vacuum chamber 101 by way of the heating means.

The support table 104 comprises a lower member 125 and an upper member 126 removably fitted to the lower member 125. The upper member 126 comprises a disclike central projection 126a and an electrostatic attracting sheet 127 is disposed on the top of the projection 126a. A wafer 103 is attracted to the electrostatic adsorption sheet 127 on the projection 126a of the upper member 126 by Coulomb's force. Said electrostatic attracting sheet 127 comprises an insulating sheet 127a made of an insulating material such as polyimide and a conductive copper sheet 128 buried in said insulating sheet 127a. The conductive sheet 128 is connected to a DC power supply (not shown).

The liquid nitrogen containing section 106 is disposed on the bottom wall 121b of the lower chamber 121 with an insulating annular member 131 interposed therebetween and contains liquid nitrogen 147 in it so that the wafer 103 to be processed is cooled by liquid nitrogen 147. The liquid nitrogen containing section 106 is provided with a gas inlet pipe 148 for feeding the containing section 106 with liquid nitrogen therethrough and a gas outlet pipe 149 to discharge any overflowing liquid gas therethrough. A gas supply pipe (not shown) is arranged between the liquid nitrogen containing section 106 and the upper member 126 so that cooling gas such as He may pass therethrough under pressure to further cool the object of processing 103 that has been cooled by liquid nitrogen.

A heater 144 is disposed in the upper member 126 of the support table 104 for heating the wafer 103. Thus, the object of processing 103 can be held to any desired temperature below 0° C. by liquid nitrogen 147 and the heater 144.

The side surface and bottom surface of the support table 104 are covered with the support table accommodating section 105. A space 129 is defined between the inner surface of the side wall of the section 105 and the support table 104. The upper end of the space 129 is hermetically sealed by an O-ring 130. Another space 132 is defined by the inner surface of the side wall 121a of the lower chamber 121, the support table accommodating section 105 and the liquid nitrogen containing section 106. The upper end portion of the space 32 is hermetically sealed by another O-ring 133. The spaces 129 and 132 provide vacuum insulating layers by means of O-rings 130 and 133. The support table accommodating section 105 and the annular member 131 are provided with respective holes so that the spaces 129 and 132 can communicate with the outer space through the holes respectively.

The RF power supply 109 is connected to the upper member 126 of the support table 104 by way of a conductive rod 153 so that the upper member 126 operates as a lower electrode. Said conductive rod 153 is housed in an insulating tubular member 154 that extends from the bottom wall 121b to the lower surface of the upper wall of the liquid nitrogen containing section 106 through the bottom wall of the liquid nitrogen containing section 106. An O-ring 155 is interposed between the tubular member 154 and the bottom wall 121b while another O-ring 156 is interposed between the tubular member 154 and the conductive rod 153.

The top wall 122b operates as an upper electrode and is grounded. Thus, a pair of parallel plate electrodes are formed by the upper wall 122b, or the upper electrode and the support table 104, or the lower electrode, which is connected to the RF power source 109 and a high frequency electric field produced between the electrodes.

The magnet section 108 comprises a support member 151 which is horizontally arranged right above the vacuum chamber 101, a permanent magnet magnetic circuit 152 supported on said support member 151 and a motor (not shown) for driving said support member 151 and said permanent magnet magnetic circuit 152 to rotate in a sense as indicated by arrow X in FIG. 16. Here, the first embodiment as described earlier is used for the permanent magnet magnetic circuit 152. More specifically, a pair of adjusting magnet blocks 3A, 3B are provided on the stepped portions between the two main magnetic poles of the main magnet block 1. Therefore, a unidirectional horizontal magnetic field which is practically free of any vertical components can be formed over a wide range near the surface of the object of processing 103. The high frequency electric field between the upper wall 122b and the support table 104 and the horizontal magnetic field are perpendicular to each other and consequently plasma can be generated there by magnetron discharge in the crossed electromagnetic field.

A gas hole 157 is formed through the upper member 126, the lower member 125, the bottom wall of the support table accommodating section 105 and the top wall of the liquid nitrogen containing section 106 to connect the upper member 126 and the object to be processed 103. Heat transmitting gas is supplied to the object 103 by way of the hole 157 and a pipe 158 that communicates with the hole 157 and extends from a gas supply source to the lower end of the hole 157 through the bottom wall 121b of the lower chamber 121. Heat transmitting gas effectively transmits heat between the support table 104 and the object 103 so that the temperature of the object 103 may be accurately controlled. Reference numeral 159 in FIG. 16 denotes a heater to heat the vacuum chamber 101.

In performing an etching operation on an object 103 by using the apparatus having a configuration as described above, firstly the object 103 to be processed, e.g., a semiconductor wafer, is brought into the vacuum chamber 101 from a load lock chamber (not shown) located adjacent to the vacuum chamber 101 and loaded on the electrostatic adsorption sheet 127. Then, a DC voltage of 2 kV is applied to the conductive sheet 128.

Thereafter, the inside of the vacuum chamber 101 is evacuated into a vacuum of $10^{-2}$ to $10^{-4}$ Torr order. Then, etching gas is fed into the plasma forming region of the vacuum chamber 101 from the etching gas supply source 107 via the gas supply pipe 134, the gas supply hole 135, the space 136 and the diffusion holes 137. Under this condition, high frequency electricity is supplied from the RF power supply 109 between the upper wall 122b which surves as the upper electrode and the support table 104 which is surves as the lower electrode. Since a horizontal magnetic field is produced by the permanent magnet magnetic circuit 152 between the two electrodes, consequently a crossed electromagnetic field is produced on the surface of the object 103 and plasma formed by magnetron discharge is generated on the surface of the object 103.

In magnetron discharge, electrons existing between the electrodes show cyclotronic movement so as to increase the number of collisions of the electrons against molecules so as to ionize the molecules. As a result, such a high etching rate as 1 μm/min can be achieved under a relative low pressure between $10^{-2}$ and $10^{-4}$ Torr order. Magnetron discharge permits a highly vertical etching in addition to the etching under such a low pressure.

Since the permanent magnet magnetic circuit 152 can generate a horizontal magnetic field which is substantially free of any vertical components over a wide range as described earlier, an uniformly distributed plasma condition can be produced with high efficiency by magnetron discharge using such a permanent magnet magnetic circuit to remarkably improve the efficiency and uniformity of an etching operation. By rotating the permanent magnet magnetic circuit 152, the consistency of magnetron discharge can be ensured.

Additionally, since the temperature of the object of processing 103 can be maintained to a desired temperature below 0° C. by means of liquid nitrogen fed from the liquid nitrogen containing section 106 during the etching operation utilizing magnetron discharge, the speed of the etching operation can be further improved.

While the adjusting magnet blocks are magnetized in a direction perpendicular or substantially perpendicular to the direction of magnetization of the main magnet block in any of the above described embodiments, they may alternatively be magnetized in any direction that is different from the direction of magnetization of the main magnet block.

The main magnet block of any of the above described embodiments may be replaced by a plurality of magnet blocks. Similarly, the adjusting magnet blocks of any of the above embodiments may be replaced by a single or more than two magnet blocks.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A permanent magnet magnetic circuit comprising:
a main magnet block having a pair of opposite outer surfaces;
a pair of main magnetic poles of opposite polarities formed on the respective outer surfaces of the main magnet block;
compensating magnetic pole means for controlling the direction of the magnetic field directed from one of said main magnetic poles to the other magnetic pole; and
adjusting magnetic field generating means provided between said pair of opposite outer surfaces of said main magnet block for producing a magnetic field directed to a direction other than the direction of magnetization of said main magnet block to control the magnetic field directed from one of said main magnetic poles to the other main magnetic pole;
wherein said adjusting magnetic field generating means comprises a pair of adjusting magnetic blocks, said adjusting magnetic blocks being disposed at respective positions corresponding to said respective main magnetic poles and being magnetized in a direction perpendicular to or substantially perpendicular to the direction of magnetization of the maid magnet block.

2. A permanent magnet magnetic circuit according to claim 1, wherein said compensating magnetic pole means comprise a pair of compensating magnetic poles, said compensating magnetic poles being situated at respective positions corresponding to the respective main magnetic poles having opposite polarities.

3. A permanent magnet magnetic circuit according to claim 2, wherein said main magnet block comprises a channel defined between said pair of opposite outer surfaces, said channel having a pair of inner surfaces respectively corresponding to said pair of outer surfaces, said compensating magnet poles being situated respectively on said pair of inner surfaces.

4. A permanent magnet magnetic circuit according to claim 3, wherein said inner surfaces are either of stepwise shaped surfaces or of smooth continuous shaped surfaces.

5. A permanent magnet magnetic circuit according to claim 1, wherein said main magnet block comprises a channel defined between said pair of opposite outer surfaces, said channel having a pair of inner surfaces corresponding to said respective outer surfaces, said adjusting magnet block being provided on said respective inner surfaces.

6. A permanent magnet magnetic circuit according to claim 5, wherein said inner surfaces are either of stepwise shaped surfaces or of smooth continuous shaped surfaces.

7. A permanent magnet magnetic circuit according to claim 1, wherein said main magnet block has a rectangular or cylindrical body.

* * * * *